(12) United States Patent
Liu et al.

(10) Patent No.: US 10,903,280 B2
(45) Date of Patent: Jan. 26, 2021

(54) ORGANIC LIGHT-EMITTING DIODE DISPLAY PANEL, METHOD FOR FABRICATING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Xiaoning Liu, Beijing (CN); Li Sun, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/425,176

(22) Filed: May 29, 2019

(65) Prior Publication Data
US 2020/0091249 A1 Mar. 19, 2020

(30) Foreign Application Priority Data
Sep. 13, 2018 (CN) .......................... 2018 1 1067068

(51) Int. Cl.
*H01L 27/32* (2006.01)
*H01L 51/00* (2006.01)
(Continued)

(52) U.S. Cl.
CPC ........ *H01L 27/3211* (2013.01); *G09G 3/2003* (2013.01); *H01L 27/3246* (2013.01); *H01L 51/0005* (2013.01); *H01L 51/5206* (2013.01)

(58) Field of Classification Search
CPC ............. H01L 27/3211; H01L 27/3246; H01L 51/0005; H01L 51/5206; G09G 3/2003
See application file for complete search history.

(56) References Cited

U.S. PATENT DOCUMENTS

2007/0291574 A1  12/2007 Noda
2009/0284135 A1  11/2009 Yoshida et al.
(Continued)

FOREIGN PATENT DOCUMENTS

CN  1612656 A  5/2005
CN  1868240 A  11/2006
(Continued)

OTHER PUBLICATIONS

Office Action for corresponding Chinese Application 201811067068.6 dated Feb. 3, 2020.
(Continued)

*Primary Examiner* — Wing H Chow
(74) *Attorney, Agent, or Firm* — Arent Fox LLP; Michael Fainberg

(57) ABSTRACT

Disclosed are an organic light-emitting diode display panel, a method for fabricating the same, and a display device. The panel includes: a base substrate, a reflecting metal layer located on the base substrate, and a protruding layer located on the reflecting metal layer; a material of the protruding layer is an inorganic material, the protruding layer comprises a plurality of pixel openings distributed in an array, and the plurality of pixel openings constitute a plurality of sub-pixel areas in different colors, the display panel further comprising an anode layer, an organic functional layer, and a cathode layer stacked in each of the sub-pixel areas sequentially; a structure with a micro-resonant chamber effect is formed between a upper surface of the reflecting metal layer and a lower surfaces of the cathode layer in each of the sub-pixel areas; anode layers in the sub-pixel areas in the different colors have different thicknesses.

12 Claims, 5 Drawing Sheets

(51) Int. Cl.
    *G09G 3/20*    (2006.01)
    *H01L 51/52*   (2006.01)

(56) References Cited

U.S. PATENT DOCUMENTS

| | | |
|---|---|---|
| 2009/0284146 A1 | 11/2009 | Yoshida et al. |
| 2011/0241038 A1 | 10/2011 | Kashiwabara |
| 2014/0225102 A1 | 8/2014 | Ikeda |
| 2016/0268355 A1 | 9/2016 | Shi et al. |
| 2019/0006427 A1 | 1/2019 | Lu et al. |
| 2019/0148468 A1 | 5/2019 | Jia et al. |

FOREIGN PATENT DOCUMENTS

| | | |
|---|---|---|
| CN | 101086591 A | 12/2007 |
| CN | 101543135 A | 9/2009 |
| CN | 101543136 A | 9/2009 |
| CN | 103024960 A | 4/2013 |
| CN | 103915471 A | 7/2014 |
| CN | 103985732 A | 8/2014 |
| CN | 104659287 A | 5/2015 |
| CN | 206194793 A | 5/2017 |
| CN | 107068722 A | 8/2017 |
| CN | 107887423 A | 4/2018 |
| CN | 108258153 A | 7/2018 |
| KR | 20150074367 A | 7/2015 |

OTHER PUBLICATIONS

Office Action for corresponding Chinese Application No. 201811067068.6 dated May 18, 2020.

ORGANIC LIGHT-EMITTING DIODE DISPLAY PANEL, METHOD FOR FABRICATING THE SAME, AND DISPLAY DEVICE

CROSS-REFERENCE TO RELATED APPLICATION

This application claims priority of Chinese Patent Application No. 201811067068.6, filed on Sep. 13, 2018, which is hereby incorporated by reference in its entirety.

FIELD

The present disclosure relates to the field of display technologies, and particularly to an organic light-emitting diode display panel, a method for fabricating the same, and a display device.

BACKGROUND

An Organic Light-Emitting Diode (OLED) display panel with the advantages of self-light-emission, a rapid response, a wide angle of view, high brightness, high saturation, a low weight, a small thickness, etc., as compared with a Liquid Crystal Display (LCD) panel has become one of focuses in the fields of researches on displays, and is recognized as a next-generation display technology.

The OLED display devices are tending to evolve into high-definition and all-color OLED display devices. An opening ratio of a top-emitting OLED element emitting light from a cathode thereof can be improved. The top-emitting OLED element includes an anode, a cathode, and an organic light-emitting material layer located between the anode and the cathode, where the anode generally has a high-reflectivity characteristic, and the cathode is generally made of transparent metal. In the OLED element, positive charges (holes) and negative charges (electrons) are injected respectively from the anode and the cathode into the light-emitting material layer, and recombined in the light-emitting material layer, thus resulting in an excited state in which light can be emitted.

SUMMARY

Some embodiments of the disclosure provide an organic light-emitting diode display panel including: a base substrate, a reflecting metal layer located on the base substrate, and a protruding layer located on the reflecting metal layer, wherein a material of the protruding layer is an inorganic material, the protruding layer comprises a plurality of pixel openings distributed in an array, and the plurality of pixel openings constitute a plurality of sub-pixel areas in different colors, the display panel further comprising an anode layer, an organic functional layer, and a cathode layer stacked in each of the sub-pixel areas sequentially, wherein:

a structure with a micro-resonant chamber effect is formed between a upper surface of the reflecting metal layer and a lower surfaces of the cathode layer in each of the sub-pixel areas, wherein anode layers in the sub-pixel areas in the different colors have different thicknesses.

Optionally, in the organic light-emitting diode display panel above according to some embodiments of the disclosure, the display panel further includes a pixel definition layer clad on a surface of the protruding layer to isolate the protruding layer from the organic functional layers, wherein a upper surface of the pixel definition layer is lyophobic.

Optionally, in the organic light-emitting diode display panel above according to some embodiments of the disclosure, the inorganic material includes $SiN_x$.

Optionally, in the organic light-emitting diode display panel above according to some embodiments of the disclosure, each of the sub-pixel comprises a red sub-pixel, a green sub-pixel, and a blue sub-pixel, wherein a thickness of the anode layer in the red sub-pixel is larger than a thickness of the anode layer in the green sub-pixel, and a thickness of the anode layer in the green sub-pixel is larger than a thickness of the anode layer in the blue sub-pixel.

Optionally, in the organic light-emitting diode display panel above according to some embodiments of the disclosure, a thickness of the protruding layer is larger than a sum of thicknesses of the anode layer and the organic functional layer.

Correspondingly, some embodiments of the disclosure further provide a display device including the organic light-emitting diode display panel above according to some embodiments of the disclosure.

Correspondingly, some embodiments of the disclosure further provides a method for fabricating an organic light-emitting diode display panel, the method including:

forming the reflecting metal layer on the base substrate;

forming the protruding layer on the base substrate formed with the reflecting metal layer;

forming a pattern of the anode layers with different thicknesses in the sub-pixel areas in different colors in an inkjet printing process; and forming the organic functional layers and the cathode layers on the anode layers in the sub-pixel areas in the different colors sequentially.

Optionally, in the fabricating method above according to some embodiments of the disclosure, the forming the pattern of the anode layers with the different thicknesses in the respective sub-pixel areas in the different colors in the inkjet printing process includes:

spraying ink at different concentrations comprising an anode layer material in the sub-pixels in the different colors on the base substrate in the inkjet printing process; and drying and annealing the ink to form the pattern of the anode layers with different thicknesses in the sub-pixels.

Optionally, in the fabricating method above according to some embodiments of the disclosure, after the anode layers are formed, and before the organic functional layers are formed, the method further includes: forming the pixel definition layer clad on a surface of the protruding layer to isolate the protruding layer from the organic functional layers, wherein the a surface of the pixel definition layer is lyophobic, wherein:

forming the organic functional layers comprises: spraying ink comprising an organic functional layer material on the anode layers in the inkjet printing process, and drying the ink to form a pattern of the organic functional layers on the anode layers.

Optionally, in the fabricating method above according to some embodiments of the disclosure, a concentration of the ink, comprising the anode layer material, sprayed in the red sub-pixel area is higher than a concentration of the ink, comprising the anode layer material, sprayed in the green sub-pixel area, and a concentration of the ink, comprising the anode layer material, sprayed in the green sub-pixel area is higher than the concentration of the ink, comprising the anode layer material, sprayed in the blue sub-pixel area.

DETAILED DESCRIPTION OF THE EMBODIMENTS

Figure 1:
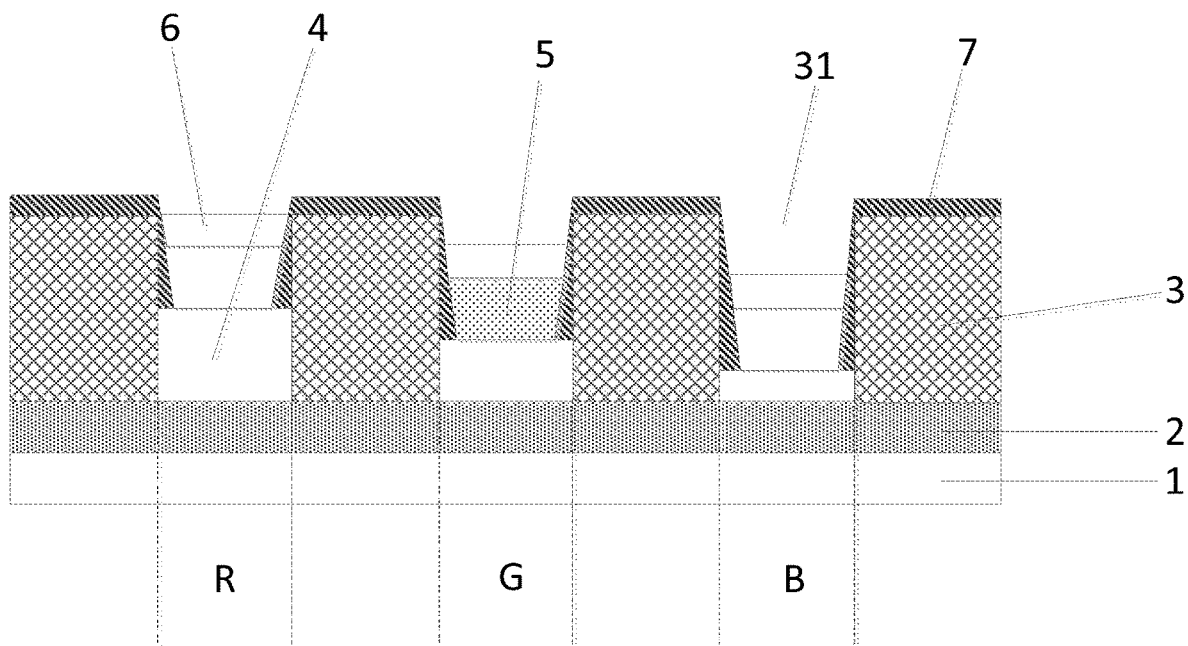
FIG. 1 is a schematic structural diagram of an organic light-emitting diode display panel according to some embodiments of the disclosure.

In order to make the objects, technical solutions, and advantages of the disclosure more apparent, the disclosure will be described below in further details with reference to the drawings. Apparently the embodiments to be described are only a part but all of the embodiments of the disclosure. Based upon the embodiments here of the disclosure, all of other embodiments which can occur to those ordinarily skilled in the art without any inventive effort shall come into the scope of the disclosure as claimed.

The shapes and sizes of respective components in the drawings are not intended to reflect any real proportion, but only intended to illustrate the disclosure of the disclosure.

As illustrated in FIG. 1, an organic light-emitting diode display panel according to some embodiments of the disclosure includes: a base substrate 1, a reflecting metal layer 2 located on the base substrate 1, and a protruding layer 3 located on the reflecting metal layer 2, where the material of the protruding layer 3 is an inorganic material, the protruding layer 3 includes a plurality of pixel openings 31 distributed in an array, and the plurality of pixel openings 31 constitute a plurality of sub-pixel areas in different colors (e.g., red sub-pixels R, green sub-pixels G, and blue sub-pixels B as illustrated); and the display panel further includes an anode layer 4, an organic functional layer 5, and a cathode layer 6 stacked in the respective sub-pixel areas sequentially.

Structures with a micro-resonant chamber effect is formed between the upper surface of the reflecting metal layer 2 and the lower surfaces of the cathode layers 6, in the respective sub-pixel areas. The anode layers 4 in the respective sub-pixel areas in the different colors have different thickness.

In the organic light-emitting diode display panel above according to some embodiments of the disclosure, the saturation of light emitted from the OLED display panel, and the assembly efficiency thereof can be improved due to the micro-resonant chamber effect, where the micro-resonant chamber effect refers to that photons emitted from a light-emitting layer may interfere with each other between the upper surface of the reflecting metal layer, and the lower surface of a cathode layer, thus resulting in interference where only the light at some specific wavelength is enhanced, and the other light is weaken. Since there are different wavelengths of light emitted in the respective sub-pixel areas in the different colors, the thicknesses of the anode layers in the respective sub-pixel areas in the different colors can be adjusted to thereby adjust the lengths of their micro-resonant chambers (the distances between the upper surface of the reflecting metal layer, and the lower surfaces of the cathode layers) so that the resonance wavelengths of the micro-resonant chambers are the same as or approximate to the wavelengths of light emitted in their corresponding sub-pixel areas, so only the light at the wavelengths of emitted light can exit at a specific angle to thereby improve the light-emission characteristic of OLED elements. Accordingly in some embodiments of the disclosure, the thicknesses of the anode layers in the respective sub-pixel areas in the different colors can be adjusted to thereby improve the saturation of light emitted from the OLED display panel, and the assembly efficiency thereof due to the micro-resonant chamber effect. Furthermore, in some embodiments of the disclosure, the protruding layer can be made of an inorganic material to define the respective sub-pixel areas so as to prevent the OLED elements from being affected by the ambient water and air, thus further improving the lifetime of the OLED elements.

It shall be noted that the micro-resonant chamber effect refers to that photons emitted from a light-emitting layer may interfere with each other between the reflecting metal layer and a cathode layer, thus resulting in interference where only the light at some specific wavelength is enhanced, and the other light is weaken. For the sake of simplicity, the micro-resonant chamber can be regarded as a Fabry-Perot resonant chamber satisfying the equations of:

$$\begin{cases} \dfrac{2L}{\lambda} - \dfrac{\varphi}{2\pi} = m \\ L = d \times n \end{cases}$$

where L represents the optical length between the reflecting metal layer and the cathode layer, d represents the distance between the upper surface of the reflecting metal layer and the lower surface of the cathode layer in some embodiments of the disclosure, n represents a refractive index, $\lambda$ represents the resonant wavelength of the micro-resonant chamber, m is an integer corresponding to the order of a resonant mode, and $\varphi$ represents the total sum of differences in phase of reflection from the cathode layer and the reflecting metal layer. The optical length L, i.e., the distance d between the upper surface of the reflecting metal layer, and the lower surface of the cathode layer, can be adjusted so that the resonant wavelength $\lambda$ of the micro-resonant chamber is the same as or approximate to the wavelength of light emitted from the organic light-emitting material, so only the light at the wavelength of organic light emission can exit at a specific angle, thus improving the light-emission characteristic of the OLED element.

In some embodiments of the disclosure, the thicknesses of the anode layers in the respective sub-pixel areas in the different colors can be adjusted to thereby adjust the distances d between the upper surface of the reflecting metal layer, and the lower surfaces of the cathode layers, and thus the optical lengths L so that the resonant wavelengths $\lambda$ of the micro-resonant chambers are the same as or approximate to the wavelengths of light emitted in their corresponding sub-pixel areas, thus improving the saturation and the light exit efficiency at the wavelengths of emitted light.

Furthermore, in the organic light-emitting diode display panel above according to some embodiments of the disclosure, as illustrated in FIG. 1, the display panel further includes a pixel definition layer 7 is clad on the surface of the protruding layer 3 to isolate the protruding layer 3 from the organic functional layers 5, where the upper surface of the pixel definition layer 7 is lyophobic. Since the upper surface of the pixel definition layer 7 is lyophobic, when the organic functional layers 5 are subsequently formed in an inkjet printing process, ink drops in the respective sub-pixel areas can be prevented from climbing up the pixel definition layer 7, to thereby greatly reduce the height up which the ink drops climb so as to make the thicknesses of the formed organic functional layer 5 uniform.

Furthermore, in the organic light-emitting diode display panel above according to some embodiments of the disclosure, the inorganic material includes $SiN_x$. Since the anode layers in some embodiments of the disclosure are formed through inkjet printing, anode layer solution shall be dried and annealed, and since $SiN_x$ has high thermal performance and heat resistance, the anode layers can be easily formed.

Furthermore, in the organic light-emitting diode display panel above according to some embodiments of the disclosure, as illustrated in FIG. 1, a sub-pixels includes a red sub-pixel R, a green sub-pixel G, and a blue sub-pixel B, where the thickness of the anode layer 4 in the red sub-pixel R is larger than the thickness of the anode layer 4 in the green sub-pixel G, and the thickness of the anode layer 4 in the green sub-pixel G is larger than the thickness of the anode layer 4 in the blue sub-pixel B. Since the wavelength of light emitted in the red sub-pixel R area is longer than the wavelength of light emitted in the green sub-pixel G area, and the wavelength of light emitted in the green sub-pixel G area is larger than the wavelength of light emitted in the blue sub-pixel B area, the resonance wavelength of the micro-resonant chamber in the red sub-pixel R area is longer than the resonance wavelength of the micro-resonant chamber in the green sub-pixel G area, and the resonance wavelength of the micro-resonant chamber in the green sub-pixel G area is longer than the resonance wavelength of the micro-resonant chamber in the blue sub-pixel B areas, so the length of the micro-resonant chambers in the red sub-pixel R areas is larger than the length of the micro-resonant chamber in the green sub-pixel G area, and the length of the micro-resonant chamber in the green sub-pixel G area is larger than the length of the micro-resonant chamber in the blue sub-pixel B area. Since the thicknesses of the anode layers are adjusted to thereby adjust the lengths of the micro-resonant chambers, the thickness of the anode layer 4 in the red sub-pixel R is larger than the thickness of the anode layer 4 in the green sub-pixel G, and the thickness of the anode layer 4 in the green sub-pixel G is larger than the thickness of the anode layer 4 in the green sub-pixel B.

Furthermore, in the organic light-emitting diode display panel above according to some embodiments of the disclosure, as illustrated in FIG. 1, the thickness of the protruding layer 3 can be set according to the thickness of the light-emitting elements, and optionally the thickness of the protruding layer 3 is larger than the sum of the thicknesses of an anode layer 4 and an organic functional layer 5.

Figure 2:
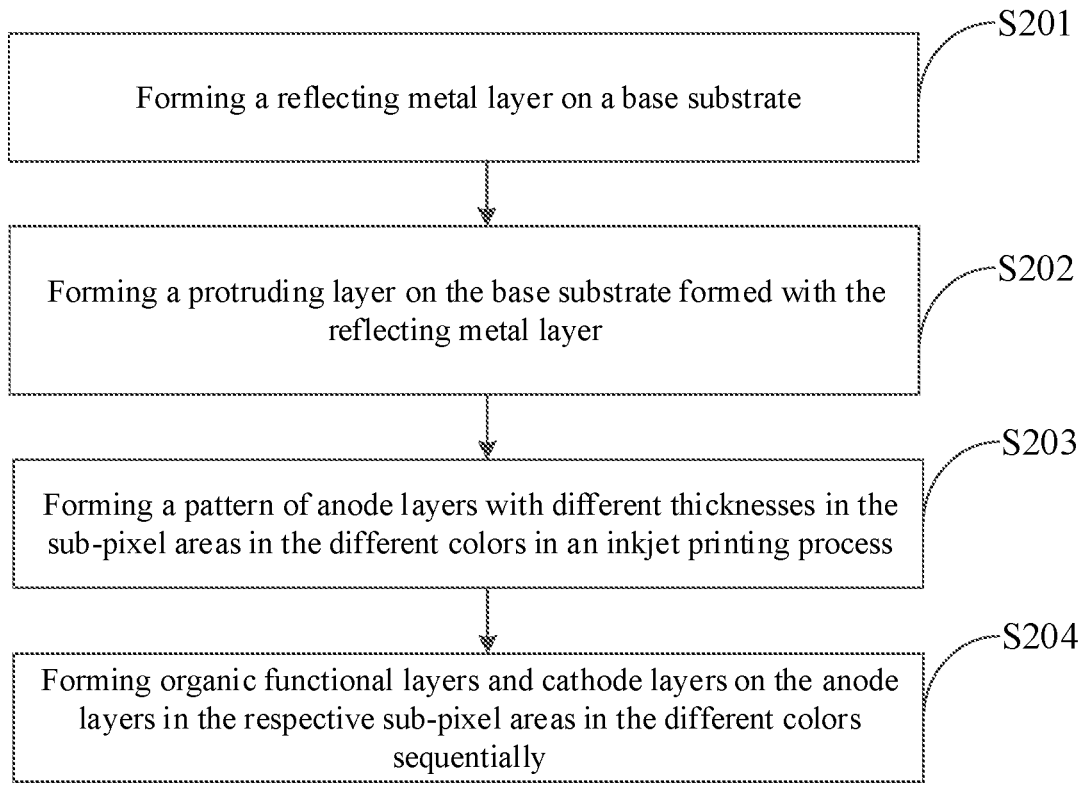
FIG. 2 is a first schematic diagram of a method for fabricating an organic light-emitting diode display panel according to some embodiments of the disclosure.

Based upon the same inventive idea, some embodiments of the disclosure further provide a method for fabricating a display panel, and as illustrated in FIG. 2, the method includes: the step S201 is to form a reflecting metal layer on a base substrate; the step S202 is to form a protruding layer on the base substrate formed with the reflecting metal layer;

optionally, the material of the protruding layer is $SiN_x$ with high thermal performance, the $SiN_X$ layer is coated on the base substrate formed with the reflecting metal layer, a plurality of pixel openings distributed in an array are formed in a dry etching process, and the plurality of pixel openings constitute a plurality of sub-pixel areas in different colors;

the step S203 is to form a pattern of anode layers with different thicknesses in the respective sub-pixel areas in the different colors in an inkjet printing process; and the step S204 is to form organic functional layers and cathode layers above the anode layers in the respective sub-pixel areas in the different colors in that order.

In the method above for fabricating an organic light-emitting diode display panel according to some embodiments of the disclosure, the anode layers with the different thicknesses can be formed in the respective sub-pixel areas in the different colors in the inkjet printing process to thereby improve the saturation of light emitted from the OLED display panel, and the assemble efficiency thereof due to a micro-resonant chamber, and with the inkjet printing process, the number of times that a mask is used to form the anode layers formed in etching, vapor-plating, and other processes in the related art can be reduced to thereby improve the utilization ratio of a material; and in some embodiments of the disclosure, the protruding layer can be made of an inorganic material to define the respective sub-pixel areas so as to prevent the OLED elements from being affected by the ambient water and air, thus further improving the lifetime of the OLED elements.

Figure 3:
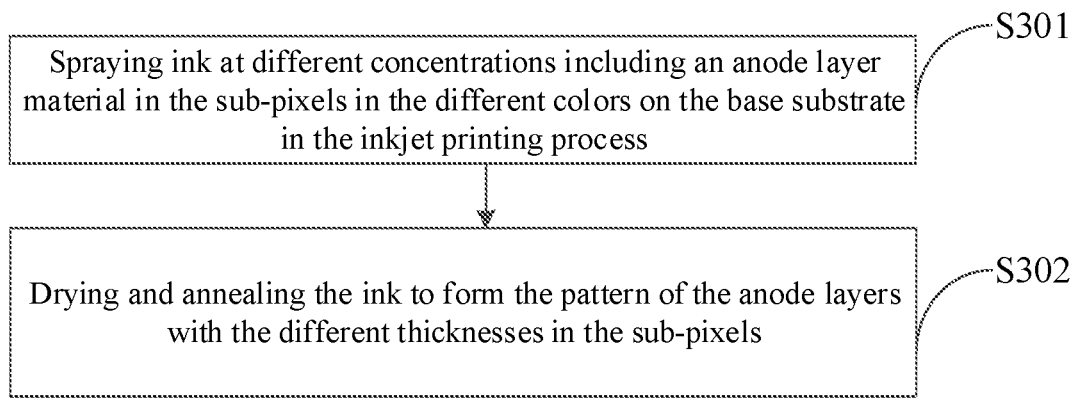
FIG. 3 is a second schematic diagram of a method for fabricating an organic light-emitting diode display panel according to some embodiments of the disclosure.

Furthermore, in the method above for fabricating an organic light-emitting diode display panel according to some embodiments of the disclosure, as illustrated in FIG. 3, forming the pattern of the anode layers with the different thicknesses in the respective sub-pixel areas in the different colors in the inkjet printing process includes:

the step S301 is to spray ink at different concentrations including an anode layer material in the respective sub-pixels in the different colors on the base substrate in the inkjet printing process; and the step S302 is to dry and anneal the ink to form the pattern of the anode layers with the different thicknesses in the respective sub-pixels.

Furthermore, in the method above for fabricating an organic light-emitting diode display panel according to some embodiments of the disclosure, after the anode layers are formed, and before the organic functional layers are formed, the method further includes: forming a pixel definition layer clad on the surface of the protruding layer to isolate the protruding layer from the organic functional layers, where the upper surface of the pixel definition layer is lyophobic, where:

forming the organic functional layers includes: spraying ink including an organic functional layer material on the anode layers in the inkjet printing process, and drying the ink to form a pattern of the organic functional layers on the anode layers.

Furthermore, in the method above for fabricating an organic light-emitting diode display panel according to some embodiments of the disclosure, the concentration of the ink, including the anode layer material, sprayed in the red sub-pixel area is higher than the concentration of the ink, including the anode layer material, sprayed in the green sub-pixel area, and the concentration of the ink, including the anode layer material, sprayed in the green sub-pixel area is higher than the concentration of the ink, including the anode layer material, sprayed in the blue sub-pixel area, so that the thickness of the anode layer 4 in the red sub-pixel R is larger than the thickness of the anode layer 4 in the green sub-pixel G, and the thickness of the anode layer 4 in the green sub-pixel G is larger than the thickness of the anode layer 4 in the blue sub-pixel B. In this way, the thicknesses of the anode layers in the respective sub-pixel areas in the different colors can be adjusted to thereby enhance the saturation of light emitted from the OLED display panel, and the assembly efficiency thereof due to the micro-resonant chamber effect.

In a particular implementation, in the method above for fabricating an organic light-emitting diode display panel according to some embodiments of the disclosure, the organic functional layers include Hole Injection Layers (HIL), Hole Transport Layers (HTL), light-emitting layers (RGB), Electron Transport Layers (ETL), Electron Injection Layers (EIL), and other layers in that order.

Optionally, in the method above for fabricating an organic light-emitting diode display panel according to some embodiments of the disclosure, the light-emitting layers include at least a red light-emitting layer, a green light-emitting layer, and a blue light-emitting layer. In addition to this, the light-emitting layer can further include a white light-emitting layer as needed for a particular arrangement of pixels, although some embodiments of the disclosure will not be limited thereto.

In a particular implementation, in the method above for fabricating an organic light-emitting diode display panel according to some embodiments of the disclosure, the material of the anode layers includes a transparent electrically-conductive material or a semi-transparent electrically-conductive material.

In a particular implementation, since there are bottom- and top-emitting organic light-emitting diodes, top-emitting organic light-emitting elements are structured of transparent cathodes and reflecting anodes in the organic light-emitting diode display panel above in some embodiments of the disclosure, but alternatively bottom-emitting organic light-emitting elements can be structured of transparent anodes and reflecting cathodes. Accordingly the material of the cathodes varies from one organic light-emitting element structure to another, and is typically ITO, Ag, NiO, Al, graphite olefin, or another transparent or semi-transparent material with a high work function.

It shall be noted that in the method above for fabricating an organic light-emitting diode display panel according to some embodiments of the disclosure, the patterning process may include only a photolithograph process, or may include a photolithograph process and an etching step, and may also include printing, inkjet, or another process for forming a predetermined pattern, and the photolithograph process refers to a process for forming a pattern using photo-resist, a mask, an exposure machine, etc., in film formation, exposure, development, or another process flow. In a particular implementation, a corresponding patterning process can be selected for a structure to be formed in some embodiments of the disclosure.

Figure 4A:
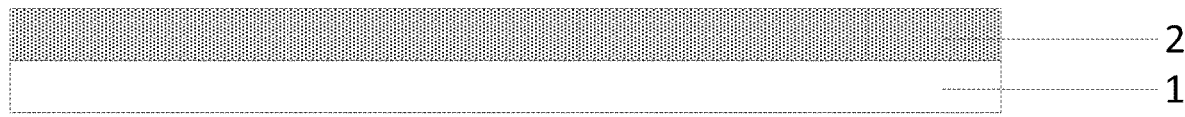
FIG. 4A to FIG. 4E are schematic structural diagrams of the organic light-emitting diode display panel according to some embodiments of the disclosure after respective steps are performed.
Figure 4B:
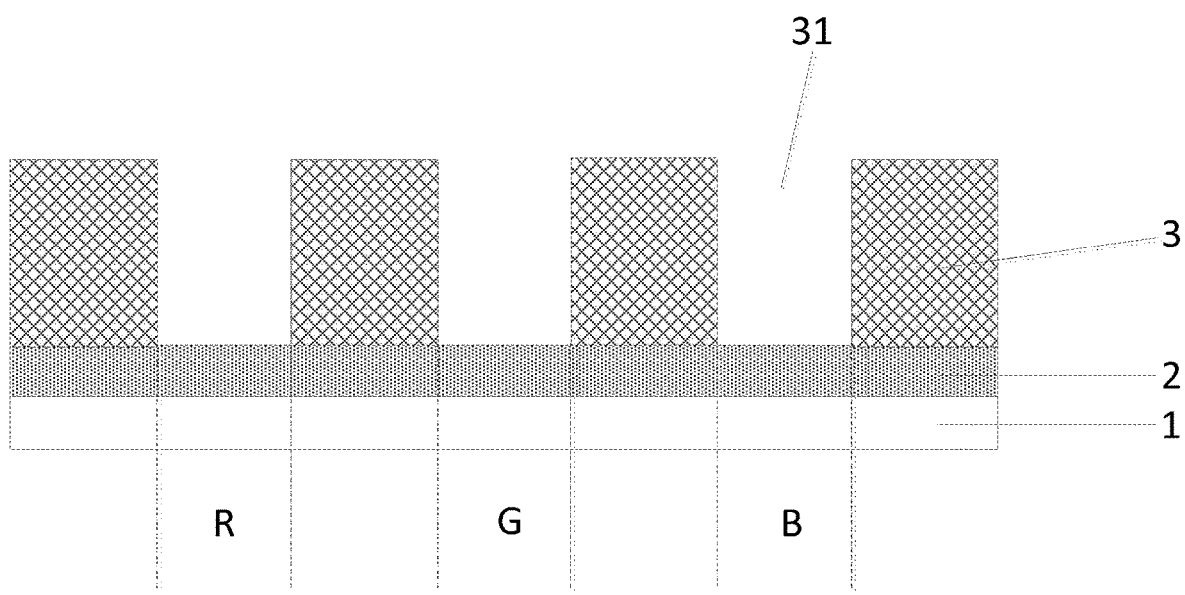
Figure 4C:
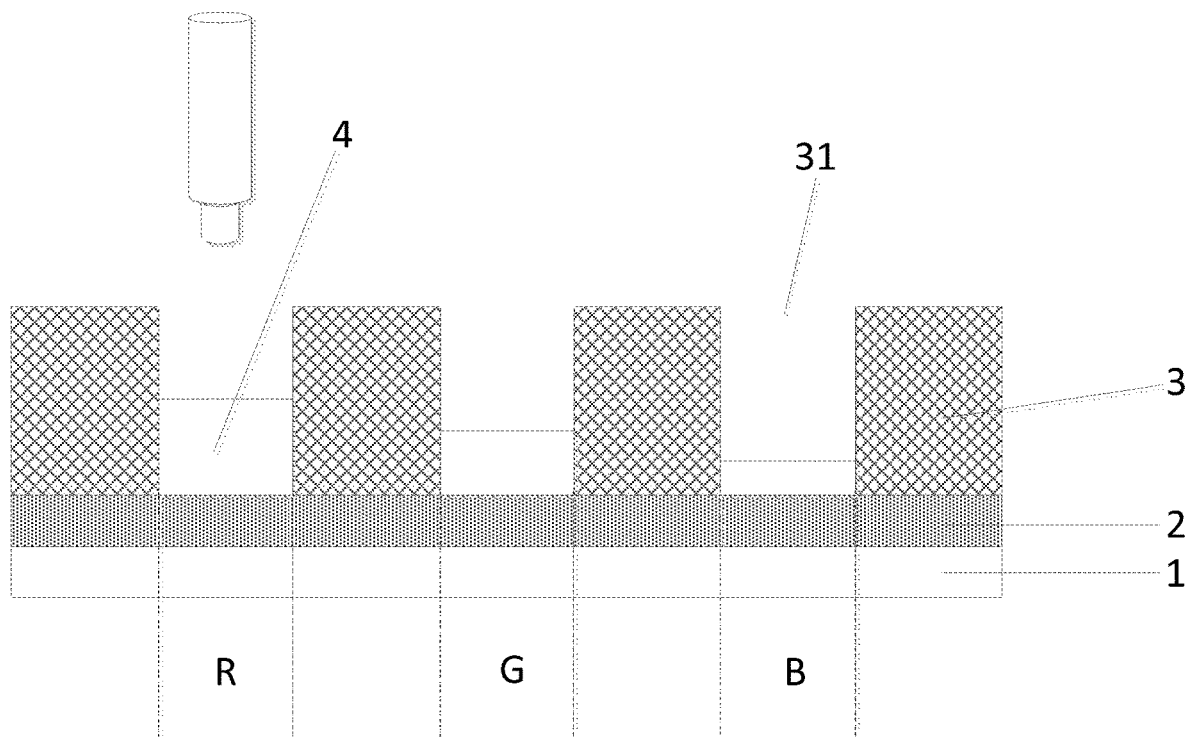
Figure 4D:
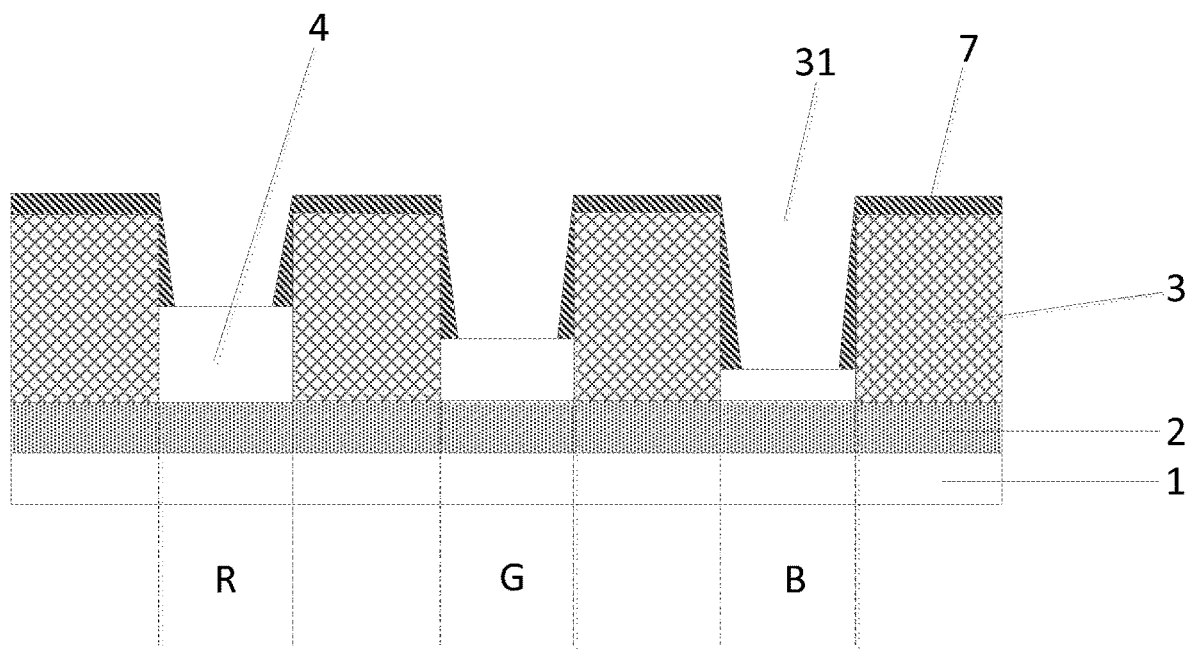
Figure 4E:
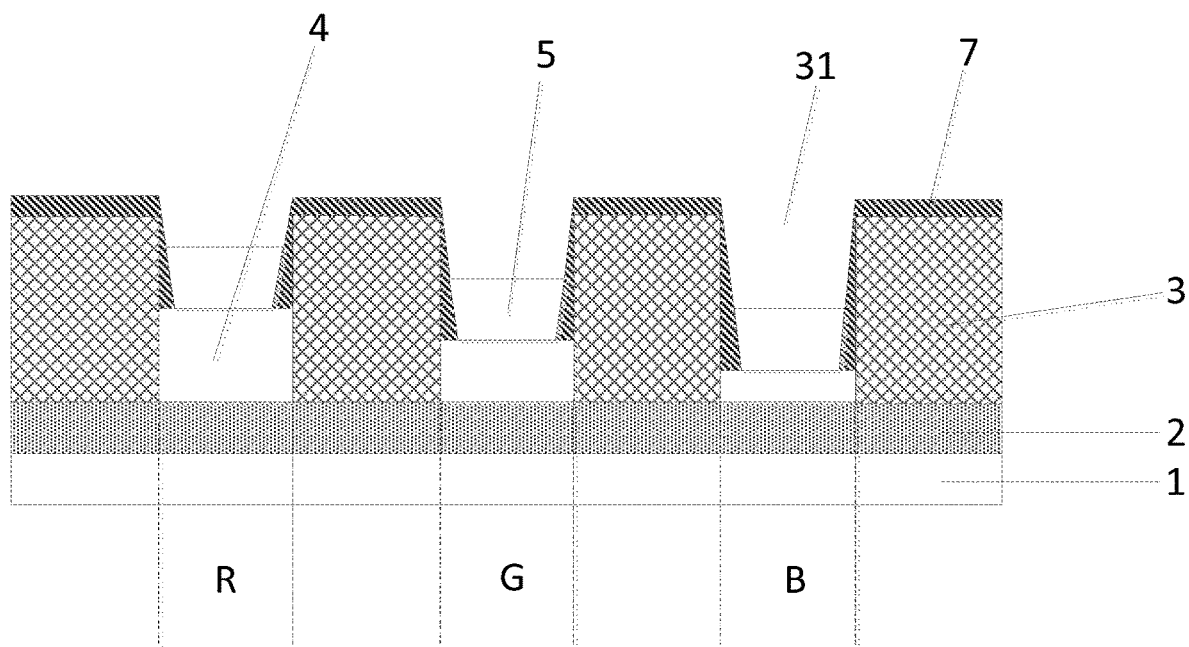

The method for fabricating the organic light-emitting diode display panel as illustrated in FIG. 1 according to some embodiments of the disclosure will be described below by way of an example, and as illustrated in FIG. 4A to FIG. 4E as well as FIG. 1, the fabricating method particularly include the following steps:

the first step is to form the reflecting metal layer 2 on the base substrate 1 as illustrated in FIG. 4A;

the second step is to coat the $SiN_x$ layer on the base substrate 1 formed with the reflecting metal layer 2, and to form the protruding layer 3 including the plurality of pixel openings 31 arranged in an array in a dry etching process, where the plurality of pixel openings 31 constitute the plurality of sub-pixel areas in the different colors, and the sub-pixel areas include the red sub-pixel R area, the green sub-pixel G area, and the blue sub-pixel B area, as illustrated in FIG. 4B;

the third step is to spray ink at different concentrations (which decrement in order) including the anode layer material in the red sub-pixel R area, the green sub-pixel G area, and the blue sub-pixel B area respectively, and to dry and anneal the ink to form the pattern of the anode layers 4 with different thicknesses (which decrement in order) respectively in the red sub-pixel R area, the green sub-pixel G area, and the blue sub-pixel B area, as illustrated in FIG. 4C, where the thicknesses of the anode layers 4 in the respective sub-pixel areas are set according to the micro-resonant chamber effect;

the fourth step is to form a thin film of photo-resist on the base substrate 1 formed with the respective anode layers 4, and to expose, develop, and bake the thin film of photo-resist using a mask to form the pixel definition layer 7 clad on the surface of the protruding layer 3, where the upper surface of the pixel definition layer 7 is lyophobic, as illustrated in FIG. 4D, where optionally, the pixel definition layer 7 shall be formed when the organic functional layers are subsequently formed in an inkjet printing process, and not formed when the organic functional layers are subsequently formed in a vapor-plating or another process;

the fifth step is to spray ink including the organic functional layer material on the anode layers 4 in an inkjet printing process, and to dry the ink to form the pattern of the organic functional layers 5 on the anode layers 4, as illustrated in FIG. 4E; and the sixth step is to form the cathode layers 6 above the organic functional layers 5, as illustrated in FIG. 1.

The organic light-emitting diode display panel according to some embodiments of the disclosure can be fabricated in the first to sixth steps above.

Based upon the same inventive idea, some embodiments of the disclosure further provide a display device including the organic light-emitting diode display panel according to some embodiments above of the disclosure. Since the display device addresses the problem under a similar principle to the organic light-emitting diode display panel above, reference can be made to the implementation of the organic light-emitting diode display panel above for an implementation of the display device, and a repeated description thereof will be omitted here.

In a particular implementation, the display device above according to some embodiments of the disclosure can be an all-screen display device, a flexible display device, etc., although some embodiments of the disclosure will not be limited thereto.

Figure 5:
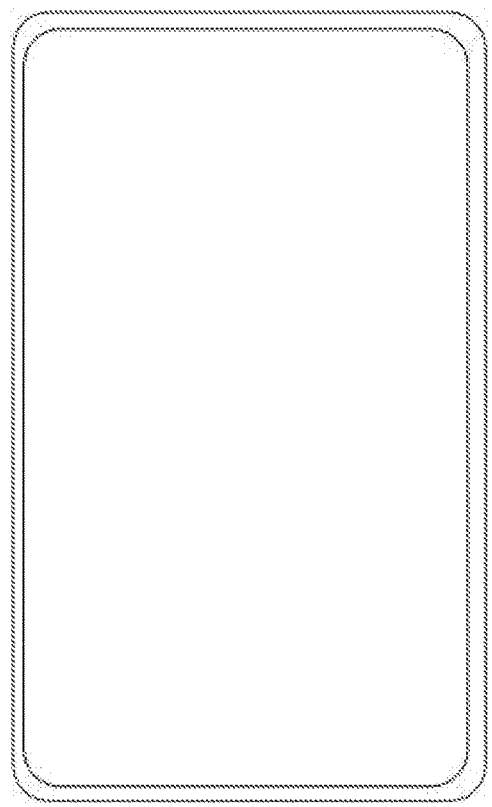
FIG. 5 is a schematic structural diagram of a display device according to some embodiments of the disclosure.

In a particular implementation, the display device above according to some embodiments of the disclosure can be an all-screen mobile phone as illustrated in FIG. 5. Of course, the display device above according to some embodiments of the disclosure can alternatively be a tablet computer, a TV set, a monitor, a notebook computer, a digital photo frame, a navigator, or any other product or component with a display function. All the other indispensable components to the display device shall readily occur to those ordinarily skilled in the art, so a repeated description thereof will be omitted here, and some embodiments of the disclosure will not be limited thereto.

In the display panel, the method for fabricating the same, and the display device above according to embodiments of the disclosure, the saturation of light emitted from the OLED display panel, and the assembly efficiency thereof can be improved due to the micro-resonant chamber effect, where the micro-resonant chamber effect refers to that photons emitted from a light-emitting layer, they may interfere with each other between the upper surface of the reflecting metal layer, and the lower surface of a cathode layer, thus resulting in interference where only the light at some specific wavelength is enhanced, and the other light is weaken. Since there are different wavelengths of light emitted in the respective sub-pixel areas in the different colors, the thicknesses of the anode layers in the respective sub-pixel areas in the different colors can be adjusted to thereby adjust the lengths of their micro-resonant chambers (the distances between the upper surface of the reflecting metal layer, and the lower surfaces of the cathode layers) so that the resonance wavelengths of the micro-resonant chambers are the same as or approximate to the wavelengths of light emitted in their corresponding sub-pixel areas, so only the light at the wavelengths of emitted light can exit at a specific angle to thereby improve the light-emission characteristic of OLED elements. Accordingly in embodiments of the disclosure, the thicknesses of the anode layers in the respective sub-pixel areas in the different colors can be adjusted to thereby improve the saturation of light emitted from the OLED display panel, and the assembly efficiency thereof due to the micro-resonant chamber effect. Furthermore, in some embodiments of the disclosure, the protruding layer can be made of an inorganic material to define the respective sub-pixel areas so as to prevent the OLED elements from being affected by the ambient water and air, thus further improving the lifetime of the OLED elements.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An organic light-emitting diode display panel, comprising: a base substrate, a reflecting metal layer located on the base substrate, and a protruding layer located on the reflecting metal layer, wherein a material of the protruding layer is an inorganic material, the protruding layer comprises a plurality of pixel openings distributed in an array, and the plurality of pixel openings constitute a plurality of sub-pixel areas in different colors, the display panel further comprising an anode layer, an organic functional layer, and a cathode layer stacked in each of the sub-pixel areas sequentially, wherein:
   a structure with a micro-resonant chamber effect is formed between a upper surface of the reflecting metal layer and a lower surfaces of the cathode layer in each of the sub-pixel areas, wherein anode layers in the sub-pixel areas in the different colors have different thicknesses;
   the protruding layer has a uniform thickness, and a thickness of the protruding layer is at least larger than a sum of thicknesses of the anode layer, the organic functional layer, and the cathode layer in the sub-pixel areas of two colors;
   a pixel definition layer clad on a surface of the protruding layer to isolate the protruding layer from the organic functional layers;
   an orthographic projection of the pixel definition layer on the base substrate is partially overlapped with an orthographic projection of the anode layer on the base substrate, and pixel definition layers in pixel openings in the different colors have different thicknesses; and
   an orthographic projection of the protruding layer on the base substrate and the orthographic projection of the anode layer on the base substrate do not overlap each other.

2. The organic light-emitting diode display panel according to claim 1, wherein a upper surface of the pixel definition layer is lyophobic.

3. The organic light-emitting diode display panel according to claim 1, wherein the inorganic material comprises SiNx.

4. The organic light-emitting diode display panel according to claim 1, wherein each of the sub-pixel comprises a red sub-pixel, a green sub-pixel, and a blue sub-pixel, wherein a thickness of the anode layer in the red sub-pixel is larger than a thickness of the anode layer in the green sub-pixel, and a thickness of the anode layer in the green sub-pixel is larger than a thickness of the anode layer in the blue sub-pixel.

5. A display device, comprising the organic light-emitting diode display panel according to claim 1.

6. The display device according to claim 5, wherein a upper surface of the pixel definition layer is lyophobic.

7. The display device according to claim 5, wherein the inorganic material comprises SiNx.

8. The display device according to claim 5, wherein each of the sub-pixel comprises a red sub-pixel, a green sub-pixel, and a blue sub-pixel, wherein a thickness of the anode layer in the red sub-pixel is larger than a thickness of the anode layer in the green sub-pixel, and a thickness of the anode layer in the green sub-pixel is larger than a thickness of the anode layer in the blue sub-pixel.

9. A method for fabricating the organic light-emitting diode display panel according to claim 1, the method comprising:
   forming the reflecting metal layer on the base substrate;
   forming the protruding layer on the base substrate formed with the reflecting metal layer;
   forming a pattern of the anode layers with different thicknesses in the sub-pixel areas in different colors in an inkjet printing process;
   forming a pixel definition layer clad on a surface of the protruding layer to isolate the protruding layer from the organic functional layers; and forming the organic functional layers and the cathode layers on the anode layers in the sub-pixel areas in the different colors sequentially.

10. The fabricating method according to claim 9, wherein forming the pattern of the anode layers with the different thicknesses in the sub-pixel areas in the different colors in the inkjet printing process comprises:
   spraying ink at different concentrations comprising an anode layer material in the sub-pixels in the different colors on the base substrate in the inkjet printing process; and
   drying and annealing the ink to form the pattern of the anode layers with different thicknesses in the sub-pixels.

11. The fabricating method according to claim 10, wherein a concentration of the ink, comprising the anode layer material, sprayed in the red sub-pixel area is higher than a concentration of the ink, comprising the anode layer material, sprayed in the green sub-pixel area, and a concentration of the ink, comprising the anode layer material, sprayed in the green sub-pixel area is higher than the concentration of the ink, comprising the anode layer material, sprayed in the blue sub-pixel area.

12. The fabricating method according to claim 9, wherein the a surface of the pixel definition layer is lyophobic, wherein:
   forming the organic functional layers comprises: spraying ink comprising an organic functional layer material on the anode layers in the inkjet printing process, and drying the ink to form a pattern of the organic functional layers on the anode layers.

* * * * *